United States Patent [19]

Hilti et al.

[11] Patent Number: 5,177,056

[45] Date of Patent: Jan. 5, 1993

[54] PLASTICS COMPOSITION CONTAINING SUPERCONDUCTORS

[75] Inventors: Bruno Hilti, Basel; Carl W. Mayer, Riehen; Jürgen Pfeiffer, Reinach; Manfred Hofmann, Marly; Max Hunziker, Düdingen, all of Switzerland

[73] Assignee: Ciba-Geigy Corporation, Ardsley, N.Y.

[21] Appl. No.: 234,189

[22] Filed: Aug. 18, 1988

[30] Foreign Application Priority Data

Aug. 21, 1987 [CH] Switzerland .................. 3215/87

[51] Int. Cl.⁵ .................................. H01B 12/06
[52] U.S. Cl. ................................ 505/1; 505/785; 252/521; 252/518; 428/930
[58] Field of Search ............... 505/1, 740, 739, 704, 505/705; 252/518; 428/390

[56] References Cited

U.S. PATENT DOCUMENTS

| | | | |
|---|---|---|---|
| 4,931,427 | 6/1990 | Chien | 505/785 |
| 4,954,481 | 9/1990 | DeReggi et al. | 505/1 |
| 5,051,399 | 7/1991 | Yoshizumi et al. | 505/1 |

OTHER PUBLICATIONS

W. Buckel, Supraleitung, p. 114, Physik-Verley GmbH, Weinheim (1972).
S. Ogawa et al., Proc. Int. Cryog. Eng. Conf., 11th vol. 11, pp. 484–488 (1986).
K. Grohmann et al., Cryogenics, vol. 17 (10) pp. 579–581 (1977).
Superconductor Week, vol. 2, p. 17 (1988).
R. J. Cava et al., Phys. Rev. Let., vol. 58, pp. 1676–1679 (1987).
D. W. Murphey et al. Phys. Rev. Let., vol. 58, pp. 1888–1890 (1987).
S. R. Ovshinsky et al., Phys. Rev. Let., vol. 58, pp. 2579–2581 (1987).
C. W. Chu et al., Phys. Rev. Let., vol. 58, pp. 405–408 (1987).
R. J. Cava et al., Nature, vol. 332, p. 814 (1988).
H. W. Zandbeigen et al., Nature, vol. 332, p. 620 (1988).
H. Maeda et al., Jap. J. Appl. Phys. Lett. 27(inpress), cited in Nature vol. 332, p. 623 (1988).
C. W. Chu et al., Phys. Rev. Lett. 60, pp. 941–943 (1988).
Superconductor Week, vol. 2, No. 14, pp. 1–8 (1988).
M. A. Subramanian et al., Nature, vol. 332, p. 420 (1988).
"Thin Film Processing and Characterization of High-Temperature Superconductors"; American Vacuum Society Series 3; Nov. 6, 1987; McAndrews et al.; pp. 451–458.

*Primary Examiner*—Mark L. Bell
*Assistant Examiner*—C. Melissa Bonner
*Attorney, Agent, or Firm*—Kevin T. Mansfield; Edward McC. Roberts

[57] ABSTRACT

Compositions of a) thermosetting plastics or thermoplastics, and a mixture of such plastics, and b) a superconducting compound having a transition temperature $T_c$ of at least 20 K are suitable as moulding materials for the production of articles for magnetic screening of static magnetic fields and for transmitting of magnetic and electrical forces.

21 Claims, No Drawings

PLASTICS COMPOSITION CONTAINING SUPERCONDUCTORS

The present invention relates to a composition containing a plastic and a superconducting compound having a transition temperature of at least 20K.

In the superconducting state, superconductors also exhibit ideal diamagnetism (Meissner effect, cf. W. Buckel, Supraleitung, page 114, Physik *Verlag GmbH Weinheia,* 1972). These materials are therefore suitable, inter alia, for screening magnetic fields. S. Ogawa et al. propose, for example, superconducting films of Nb/Ti for this purpose [Proc. Int. Cryog. Eng. Conf., 11th, pages 484-488 (1986)]. K. Grohmann et al. describe, for example, superconductors in the form of cylinders for the same purpose [Cryogenics, 17 (10), pages 579-581 (1977)]. For technical and economic reasons, it has to date been possible to use superconductors only to a limited extent for screening magnetic fields [cf.Lexikon der Physik, Frankhe-Verlag Stuttgart, headword: magnetische Abschirmung [magnetic screening](1969)].

The screening of static and low-frequency magnetic fields has to date required very low temperatures ($T<20K$) when superconductors were used, or expensive and heavy armour-plating of the apparatus or rooms to be protected, with ferromagnetic materials, at temperatures above about $20 \sim K$.

Superconductors having a transition temperature $T_0 \cong 120K$ have only recently been described [Superconductor Week 2, 17, 1988]. The use of such materials requires merely temperatures which are the same as or higher than the temperature of liquid nitrogen.

Superconducting materials are prepared from the starting materials in general by melting and/or sintering processes.

It has been found that such comminuted and finely divided materials are not superconducting but still have the ideal diamagnetism below the transition temperature. It has furthermore been found that high diamagnetism is also retained when the finely divided superconducting material is incorporated and dispersed in a plastic.

The present invention relates to a composition containing a) a thermosetting plastic or thermoplastic, a mixture of thermosetting plastics or thermoplastics or a mixture of thermosetting plastics and thermoplastics and b) mixed therewith, a superconducting compound having a transition temperature $T_c$ of at least 20K.

Examples of suitable thermoplastics and thermosetting plastics are:

1. Polymers of mono- and diolefins, for example polypropylene, polyisobutylene, polybut-1-ene, polymethylpent-1-ene, polyisoprene or polybutadiene, and polymers of cycloolefins, for example cyclopentene or norbornene; or polyethylene (which may be crosslinked), for example, high density polyethylene (HDPE), low density polyethylene (LDPE), or linear low density polyethylene (LLDPE).

2. Mixtures of the polymers stated under 1), for example mixtures of polypropylene with polyisobutylene, polypropylene with polyethylene (for example PP/HDPE, PP/LDPE) and mixtures of various polyethylene grades (for example LDPE/HDPE and LLDPE/LDPE).

3. Copolymers of mono- and diolefins with one another or with other vinyl monomers, for example ethylene-propylene copolymers, propylene-but-1-ene copolymers, propylene-isobutylene copolymers, ethylene-but-1ene copolymers, ethylene-hexene copolymers, ethylene-methylpentene copolymers, ethylene-heptene copolymers, ethylene-octene copolymers, propylene-butadiene copolymers, isobutylene-isoprene copolymers, ethylene-alkyl acrylate copolymers, ethylene-alkyl methacrylate copolymers, ethylene-vinyl acetate copolymers or ethylene-acrylic acid copolymers and their salts (ionomers), and terpolymers of ethylene with propylene and a diene, such as butadiene, isoprene, dicyclopentadiene or ethylidenenorbornene; or mixtures of such copolymers with one another and with polymers stated under 1), for example polypropylene/ethylenepropylene copolymers, LDPE/ethylene-vinyl acetate copolymers, LDPE/ethylene-acrylic acid copolymers, LLDPE/ethylene-vinyl acetate copolymers and LLDPE/ethylene-acrylic acid copolymers.

4. Polystyrene, poly-(p-methylstyrene) and poly-(o-methylstyrene).

5. Copolymers of styrene oro-methylstyrene with dienes or acrylic derivatives and optionally olefins, for example styrene-butadiene, styrene-acrylonitrile, styrene-alkyl methacrylate, styrene-butadienealkyl acrylate, styrene-maleic anhydride, acrylonitrile-styrene-acrylate copolymers (ASA), for example styrene-acrylonitrile-methyl acrylate; mixtures having high impact strength and consisting of styrene copolymers and another polymer, for example a polyacrylate, a diene polymer or an ethylene-propylene-diene terpolymer; and block copolymers of styrene, for example styrene-butadiene-styrene, styrene-isoprene-styrene, styrene-ethylene/butylene-styrene or styrene-ethylene/propylene-styrene, or acrylonitrile-ethylene-propylene-styrene (AES).

6. Graft copolymers of styrene or o-methylstyrene, for example styrene on polybutadiene, styrene on polybutadiene-styrene or polybutadieneacrylonitrile copolymers, styrene and acrylonitrile (or methacrylonitrile) on polybutadiene (ABS); styrene, acrylonitrile and methyl methacrylate on polybutadiene; styrene and maleic anhydride on polybutadiene; styrene, acrylonitrile and maleic anhydride or maleimide on polybutadiene; styrene and maleimide on polybutadiene, styrene and alkyl acrylates or alkyl methacrylates on polybutadiene, styrene and acrylonitrile on ethylene-propylene-diene terpolymers, styrene and acrylonitrile on polyalkyl acrylates or methacrylates, styrene and acrylonitrile on acrylate-butadiene copolymers, methacrylates, for example methyl methacrylate, and styrene on butadiene-styrene rubber (MBS) and their mixtures with the copolymers stated under 5).

6a. Elastomers which can be obtained by reaction, crosslinking or vulcanization of unsaturated polymers. Unsaturated polymers are obtainable by polymerization of dienes with or without olefinic comonomers.

7. Halogen-containing polymers, for example polychloroprene, chlorine rubber, fluorine rubber, chlorinated or chlorosulfonated polyethylene, epichlorohydrin homopolymers and copolymers, in particular polymers of halogen-containing vinyl compounds, for example polyvinyl chloride, polyvinylidene chloride, polyvinyl fluoride or polyvinylidene fluoride; and their copolymers, for example vinyl chloride-ethylene, vinyl chloride-vinylidene chloride, vinyl chloride-vinyl acetate or vinylidene chloride-vinyl acetate.

8. Polymers which are derived from $\alpha,\beta$-unsaturated acids and their derivatives, such as polyacrylates and polymethacrylates, polyacrylamides and polyacrylonitriles, and copolymers with maleic acid and/or maleic anhydride.

9. Copolymers of the monomers stated under 8) with one another or with other unsaturated monomers, for example acrylonitrile-butadiene copolymers, acrylonitrile-alkyl acrylate copolymers, acrylonitrilealkoxyalkyl acrylate copolymers, acrylonitrile-vinyl halide copolymers or acrylonitrile-alkyl methacrylate-butadiene terpolymers.

10. Polymers which are derived from unsaturated alcohols and amines or their acyl derivatives or acetals, such as polyvinyl alcohol, polyvinyl acetate, stearate, benzoate or maleate, polyvinyl butyral, polyallyl phthalate or polyallyl melamine; and their copolymers with olefins stated in point 1.

11. Homopolymers and copolymers of cyclic ethers, such as polyalkylene glycols, polyethylene oxide, polypropylene oxide or their copolymers with bisglycidyl ethers.

12. Polyacetals, such as polyoxymethylene, and those polyoxymethylenes which contain comonomers, for example ethylene oxide; polyacetals which are modified with thermoplastic polyurethanes, acrylates or MBS.

13. Polyphenylene oxides and sulfides and their mixtures with styrene polymers or polyamides.

14. Polyurethanes which are derived, for example, from diols and/or polyethers, polyesters and polybutadienes having terminal hydroxyl groups on the one hand and aliphatic or aromatic di- or polyisocyanates on the other hand.

15. Polyamides and copolyamides which are derived from diamines and dicarboxylic acids and/or from aminocarboxylic acids or the corresponding lactams, such as nylon 4, nylon 6, nylon 6/6, 6/10, 6/9, 6/12, and 4/6, nylon 11 and nylon 12; polyamides containing aromatic diamines, for example from m-xylenediamine and adipic acid; polyamides prepared from hexamethylenediamine and iso- and/or terephthalic acid and if desired, an elastomer as modifier, for example poly-2,4,4-trioethylhexamethyleneterephthalamide; aromatic polyamides, for example poly-m-phenyleneisophthalamide; block copolymers of the above-mentioned polyamides with polyethers, for example with polyethylene glycol, polypropylene glycol or polytetramethylene glycol; furthermore, EPDM-modified or ABS-modified polyamides or copolyamides; and polyamides condensed during processing ("RIM polyamide systems").

16. Polyureas obtained from diamines and diisocyanates, polyamidic acids and their salts, polyimides, polyamidoimides, polyetherimides and polybenzimidazoles.

17. Polyesters which are derived from dicarboxylic acids and dialcohols and/or from hydroxycarboxylic acids or the corresponding lactones, such as polyethylene terephthalate, polybutylene terephthalate, poly-1,4-dimethylolcyclohexane terephthalate, polyhydroxybenzoates, and block polyether esters which are derived from polyethers having terminal hydroxyl groups; or polyesters modified with polycarbonates or with MBS.

18. Polycarbonates and polyester carbonates.

19. Polysulfones, polyether sulfones and polyether ketones.

20. Polysiloxanes which are obtainable, for example, from methyl- or methylphenyl-siloxanes, and silicone rubber prepared by crosslinking.

21. Natural polymers, such as cellulose, natural rubber or gelatin, and their derivatives modified by polymer-analogue chemical reactions, such as cellulose acetate, propionate andbutyrate, or the cellulose ethers, such as methylcellulose, the crosslinked rubbers, or gelatin crosslinked with formaldehyde; and rosins and derivatives.

22. Mixtures (polyblends) of the abovementioned polymers, for example PP/EPDM, polyamide/EPDM or ABS, PVC/EVA, PVC/ABS, PVC/MBS, PC/ABS, PBTP/ABS, PC/ASA, PC/PBT, PVC/CPE, PVE/acrylates, POM/thermoplastic PUR, PC/thermoplastic PUR, POM/acrylate, POM/MBS, PPO/HIPS, PPO/PA 6.6 and copolymers, PA/HDPE, PA/PP and PA/PPO.

23. Crosslinked polymers which are derived from aldehydes on the one hand and phenols, urea or melamine on the other hand, such as phenolformaldehyde, urea-formaldehyde and melamine-formaldehyde resins.

24. Drying and non-drying alkyd resins; diallyl phthalate resins and furan resins.

25. Unsaturated polyester resins which are derived from copolyesters of saturated and unsaturated dicarboxylic acids with polyhydric alcohols and vinyl compounds as crosslinking agents, as well as their halogen-containing, low flammability modifications.

26. Crosslinkable acrylate resins which are derived from substituted acrylates, for example from epoxy acrylates, urethane acrylates or polyester acrylates.

27. Alkyd resins, polyester resins and acrylate resins which are crosslinked with melamine resins, urea resins, polyisocyanates or epoxy resins.

28. Bismaleimide resins obtained from aliphatic or aromatic primary di- or polyamines and maleic anhydride, which can be crosslinked alone or together with comonomers, for example with aliphatic and/or aromatic di- or polyamines and/or di- or polyphenols, allylphenol glycidyl ethers or allylbisphenol glycidyl ethers.

29. Crosslinked epoxy resins obtained from epoxy compounds having on average more than one, preferably at least 2, epoxy groups in the molecule and crosslinking agents or polyethers obtained by catalysed polymerization.

Particularly suitable epoxy resins are those having on average more than one glycidyl group, $\beta$-methylglycidyl group or 2,3-epoxycyclopentyl group bonded to a hetero atom (for example sulfur, preferably oxygen or nitrogen); the following may be mentioned in particular: bis-(2,3-epoxycyclopentyl) ether; di- and polyglycidyl ethers of polyhydric aliphatic alcohols, such as butane-1,4-diol or polyalkylene glycols, such as polypropylene glycols; di- or polyglycidyl ethers of cycloaliphatic polyols, such as 2,2-bis-(4-hydroxycyclohexyl)-propane; di- and polyglycidyl ethers of polyhydric phenols, such as resorcinol, bis-(p-hydroxyphenyl)-methane, 2,2-bis-(p-hydroxyphenyl)-propane (=diomethane), 2,2-bis-(4'-hydroxy-3',5'-dibromophenyl)-propane, 1,1,2,2-tetrakis-(p-hydroxyphenyl)-ethane, or of condensates of phenol with formaldehyde, obtained under acidic conditions, such as phenol novolaks and cresol novolaks; di- and poly-(B-methylglycidyl) ethers of the abovementioned polyhydric alcohols or polyhydric phenols; polyglycidyl esters of polybasic carboxylic acids, such as phthalic acid, terephthalic acid, $\Delta^4$-tetrahydrophthalic acid and hexahydrophthalic acid; N-glycidyl derivatives of amines, amides and heterocyclic nitrogen bases, such as N,N-diglycidylaniline, N,N-diglycidyltoluidine, N,N,O-triglycidyl-p-aminophenol, N,N,N',N'-tetraglycidyl-bis(p-aminophenyl)-methane;

triglycidyl isocyanurate; N,N'-diglycidylethyleneurea; N,N'-diglycidyl-5,5-dimethylhydantoin, N,N'-diglycidyl-5-isopropyl-hydantoin, N,N-methylenebis-(N',N'-diglycidyl-5,5-dimethylhydantoin, 1,3-bis-(N-glycidyl-5,5-dimethylhydantoin)-2-glycidyloxypropane; N,N'-diglycidyl-5,5-dimethyl-6-isopropyl-5,6-dihydrouracil; cycloaliphatic glycidyl ethers, for example vinylcyclohexene dioxide, 3,4-epoxycyclohexylmethyl 3,4-epoxycyclohexanecarboxylate.

A preferred group of epoxy resins are glycidylated novolaks, hydantoins, aminophenols, bisphenols, aromatic diamines or cycloaliphatic epoxy compounds. Particularly preferred compositions contain, as the epoxy resin, a glycidylated cresol novolak, bisphenol A diglycidyl ether or bisphenol A diglycidyl ether advanced with bisphenol A, hydantoin-N,N'-bisglycide, propylene-1,3-bishydantoin-2-hydroxytriglycide, p-aminophenoltriglycide, diaminodiphenylmethanetetraglycide, vinylcyclohexene dioxide, 3,4-epoxycyclohexylmethyl 3,4-epoxycyclohexanecarboxylate or mixtures thereof.

Other suitable compounds are prereacted adducts of such epoxides with curing agents for epoxides, for example the stated adduct of bisphenol A diglycidyl ether and bisphenol A, or adducts prereacted with oligo esters having two terminal carboxyl groups and epoxides.

Suitable curing agents for epoxy resins are acidic or basic compounds. Examples of suitable curing agents are: amines, such as aliphatic, cycloaliphatic or aromatic, primary, secondary and tertiary amines, for example ethylenediamine, hexamethylenediamine, trimethylhexamethylenediamine, diethylenetriamine, triethylenetetramine, tetraethylenepentamine, N,N-dimethylpropylene-1,3-diamine, N,N-diethylpropylene-1,3-diamine, 2,2-bis-(4'-aminocyclohexyl)-propane, 3,5,5-trimethyl-3-(aminomethyl)-cyclohexylamine ("isophoronediamine"), Mannich bases, such as 2,4,6-tris-(dimethyl-aminomethyl)-phenol; m-phenylenediamine, p-phenylenediamine, bis-(4-aminophenyl)-methane, bis-(4-aminophenyl) sulfone and m-xylylenediamine; amino alkanols, for example aminoethanol, 1,3-aminopropanol, diethanolamine or triethanolamine; adducts of acrylonitrile or monoepoxides, for example, ethylene oxide, propylene oxide or acrylonitrile, on polyalkylenepolyamines, for example diethylenetriamine or triethylenetetramine; adducts of polyamines, for example diethylenetriamine or triethylenetetramine, in excess and polyepoxides, for example bisphenol A diglycidyl ethers; polyamides, in particular those obtained from aliphatic polyamines, for example diethylenetriamine or triethylenetetramine, and di- or trimerized unsaturated fatty acids, for example dimerized linseed oil fatty acid (VERSAMID ®); dicyanodiamide; polysulfides (THIOKO ®); aniline-foroaldehydes; polyhydric phenols, for example resorcinol, 2,2-bis-(4-hydroxyphenyl)-propane or phenol-formaldehyde resins; polybasic carboxylic acids and their anhydrides, for example phthalic anhydride, Δ⁴-tetrahydrophthalic anhydride, hexahydrophthalic anhydride, 4-methylhexa hydrophthalic anhydride, 3,6-endomethylene-Δ⁴-tetrahydrophthalic anhydride, 4-methyl-3,6-endomethylene-Δ⁴-tetrahydrophthalic anhydride (=Methylnadic anhydride),3,4,5,6,7,7-hexachloro,6-endomethylene-Δ⁴-tetrahydrophthalic anhydride, succinic anhydride, adipic anhydride, trimethyladipic anhydride, azelaic anhydride, sebacic anhydride, maleic anhydride, dodecylsuccinic anhydride; pyromellitic dianhydride, trimellitic anhydride, benzophenonetetracarboxylic dianhydride or mixtures of such anhydrides.

A preferred group of curing agents comprises polyamines, novolaks, polyaminoamides and polycarboxylic anhydrides.

The epoxy resins can furthermore be cured using curing accelerators or simply by means of thermal curing catalysts. Examples are: tertiary amines, their salts or quaternary ammonium compounds, for example 2,4,6-tris-(dimethylaminomethyl)-phenol, benzyldimethylamine, 2-ethyl-4-methylimidazole or triamylammonium phenolate; mono- or polyphenols such as phenol or diomethane or salicylic acid; boron trifluoride and its complexes with organic compounds, such as $BF_3$-ether complexes and $BF_3$-amine complexes, for example $BF_3$-monoethylamine complex; acetoacetanilide-BF3 complex; phosphoric acid and triphenyl phosphite.

Curing accelerators and curing catalysts are usually added in an amount of 0.1–10% by weight, relative to the epoxy resin. Curing agents for epoxy resins are generally used in equimolar amounts, relative to the epoxy groups and functional groups of a curing agent.

The invention furthermore relates to the compositions which can be cured to give thermosetting plastics.

The plastics of the composition according to the invention may furthermore be radiation-curable or radiation-cured materials of positive or negative working systems.

Suitable radiation-curable starting materials are ethylenically unsaturated monomeric, oligomeric and polymeric compounds which react by photopolymerization or photodimerization to give relatively high molecular weight products and thus change their solubility.

Particularly suitable for this purpose are, for example, esters and amides of ethylenically unsaturated carboxylic acids and of polyols or polyepoxides or of polyamines, and polymers having ethylenically unsaturated groups in the chain or in side groups, for example unsaturated polyesters, polyamides and polyurethanes and copolymers thereof, polybutadiene and polybutadiene copolymers, polyisoprene and polyisoprene copolymers, polymers and copolymers having maleimidyl side groups, particularly dimethylmaleimidyl groups or acrylic or methacrylic groups, unsaturated epoxy resins and mixtures of one or more such polymers.

Examples of ethylenically unsaturated carboxylic acids are acrylic acid, methacrylic acid, crotonic acid, itaconic acid, cinnamic acid, and unsaturated fatty acids, such as linolenic acid or oleic acid. Preference is given to acrylic and methacrylic acid.

Suitable polyols for the esters are aromatic and in particular aliphatic and cycloaliphatic polyols. Examples of aromatic polyols are hydroquinone, 4,4-dihydroxyphenylene, bisphenols, such as bisphenol A or F, and novolaks and resols. Suitable polyepoxides for the esters are, for example, those based on the abovementioned polyols, in particular on the aromatic polyols and epichlorohydrin. Polymers or copolymers having hydroxyl groups on the polymer chain or in side groups, for example polyvinyl alcohol and copolymers thereof or hydroxyalkyl polymethacrylates, for example β-hydroxyethyl ester or copolymers thereof, are also suitable aliphatic polyols. Further suitable aliphatic polyols are oligo esters having terminal hydroxyl groups.

A preferred group of aliphatic or cycloaliphatic polyols are those of the formula $R_n(OH)_n$, in which R is an n-valent, preferably 2-valent to 8-valent, in particular 2-valent to 6-valent. aliphatic radical having 2 to 30° C. atoms, which may be interrupted by nitrogen, sulfur and in particular oxygen atoms and cycloalkylene, or cycloalkylene having 5 or 6 ring carbon atoms. Examples of such polyols are alkylene diols having preferably 2° to 12° C atoms, such as ethylene glycol, 1.2- or 1,3-propanediol, 1,2-, 1,3- or 1,4-butanediol, pentanediol, hexanediol, octanediol, dodecanediol, diethylene glycol, triethylene glycol, polyethylene glycols having molecular weights of, preferably, from 100 to 1,500, 1,3-cyclopentanediol, 1,2-, 1,3- or 1,4-cyclohexanediol, 1,4-dihydroxymethylcyclohexane, glycerol, tris-(B-hydroxyethyl)-amine, trimethylolethane, trimethylolpropane, pentaerythritol, dipentaerythritol and sorbitol.

The polyols may be partially or completely esterified with one ethylenically unsaturated carboxylic acid or with different ethylenically unsaturated carboxylic acids, and, in partial esters, the free hydroxyl groups can be modified, for example etherified, or esterified with other carboxylic acids. Examples of such esters are:

trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetracrylate, dipentaerythritol diacrylate, dipentaeryithritol triacrylate, dipentaerythritol tetraacrylate, dipentaerythritol pentaacrylate, dipentaerythritol hexaacrylate tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol dimethacrylate, 1,3-butanediol diacrylate, 1,3-butanediol dimethacrylate, 1,4-butanediol diitaconate, sorbitol triacrylate, sorbitol hexaacrylate, sorbitol tetramethacrylate, sorbitol pentaacrylate, sorbitol hexaacrylate oligo ester acrylates, oligo ester methacrylates, glycerol di- and triacrylate, 1,4-cyclohexane diacrylate, bis-acrylates and bismethacrylates of polyethylene glycol having a molecular weight of 100-1,500 or mixtures thereof.

Other suitable compounds are the amides of the same or different unsaturated carboxylic acids with aromatic, cycloaliphatic and aliphatic polyamines having preferably 2 to 6, in particular 2 to 4, amino groups and 2 to 30, in particular 2° to 18°C., atoms. Examples of amines are alkylenediamines having preferably 2° to 22° C. atoms, such as ethylenediamine, 1,2- or 1,3-propylenediamine, 1,2-, 1,3- or 1,4-butylenediamine, 1,5-pentylenediaaaine, 1,6-hexylenediamine, octylenediamine, dodecylenediamine, 1,4-diamino cyclohexane, isophoronediamine, phenylenediamine, bisphenylenediamine, di-B-aminoethyl; ether, diethylenetriamine, triethylenetetramine, di-(β-aminoethoxy)- or di(β-aminopropoxy)-ethane. Examples of such amides are: methylenebisacrylamide, 1,6-hexamethylenebisacrylamide, diethylenetriamine-trismethacrylamide, bis(methacrylamido-propoxy)-ethane, β-methacrylamidoethyl methacrylate, N-[β-hydroxyethoxy)ethyl]-acrylamide. Other suitable polyamines are polymers and copolymers having amino groups in the side chain and oligo amides having terminal amino groups.

Suitable unsaturated polyesters and polyamides as radiation-curable starting materials are derived from, for example, maleic acid and diols or diamines. The maleic acid may be partially replaced by other dicarboxylic acids. They can be used together with ethylenically unsaturated comonomers, for example styrene. The polyesters and polyamides can also be derived from dicarboxylic acids and ethylenically unsaturated diols or diamines, in particular relatively long chain ones having, for example 6° to 20° C atoms. Examples of polyurethanes are those which are synthesized from saturated or unsaturated diisocyanates and unsaturated or saturated diols.

Radiation-curable polybutadienes and polyisoprenes and copolymers thereof are known. Suitable comonomers for such copolymers are, for example, polyolefins, such as ethylene, propene, butene or hexene, acrylates and methacrylates, acrylonitrile, styrene or vinyl chloride. Radiation-curable polymers having maleimidyl groups, in particular dimethylmaleimidyl groups, in side chains are described in, for example. DE-A 2,626,795. Radiation-curable polymers having acrylate and/or methacrylate groups in the side chain are likewise known. They may be, for example, reaction products of epoxy resins based on novolak with acrylic and/or methacrylic acid, or homopolymers or copolymers of polyvinyl alcohol or their hydroxyalkyl derivatives which are esterified with acrylic and/or methacrylic acid, or homopolymers and copolymers of hydroxyalkyl acrylates or methacrylates which are esterified with acrylic or methacrylic acid. The radiation-curable unsaturated epoxy resins are mainly those which contain

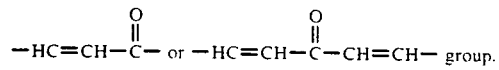

Such epoxy resins are described in, for example, DE-A 2,342,407.

The radiation-curable starting materials can be used alone or in any mixtures. It is advantageous to admix esters of unsaturated carboxylic acids, in particular the acrylates or methacrylates of polyols, and/or further vinyl compounds, for example vinylpyridine or vinylpyrrolidone.

Other suitable radiation-curable starting materials are, for example, cationically polymerizable organic materials, in the presence of radiation-activatable latent curing agents, for example epoxy resins without out $C=C$ double bonds, in particular epoxy resins based on aromatic polyols. Examples of such latent curing agents are $\alpha$- and $\beta$-acylsulfonyloxy compounds, diazoniua salts, onium salts of the elements of groups Va, VIa or VIIa of the periodic table, for example the chlorides, bromides, iodides and in particular the salts of complex acids, for example hexafluorophosphate and hexafluoroarsenate; N-sulfonyloxyimides; esters of sulfonic acids with $\beta$-methylolbenzoins and $\beta$-hydroxyacylphenones; $\alpha$-nitrobenzaldehydes and $\alpha$-chloro- or $\alpha$-bromoacylphenones. Among the onium salts, the sulfonium salts or iodonium salts, for example triphenylsulfonium hexafluorophosphate or diphenyliodonium hexafluorophosphate, are preferred. Other suitable latent curing agents are cyclopentadienylironarene salts, for example ($n^6$-methylnaphthalene)-($n^5$-cyclopentadienyl)iron(II) hexafluorophosphate. Such salts are described in, for example, EP-B-0,094,915. Arenecarbonyl and dienylcarbonyl metal salts as latent curing agents are described in EP-B-0,094,914.

Other suitable radiation-curable starting materials are oligomers and polymers, for example polyimides, which contain polyazides as crosslinking agents (cf. for example EP-B-0,092,524).

The composition preferably contains a radiation-cured epoxy acrylate or epoxy methacrylate, epoxy resin, polyester acrylate or methacrylate based on bisphenol or a polymer having maleimidyl side groups, in particular dimethylmaleimide groups.

It is also possible for a binder to be added to the radiation-curable materials, which is particularly advantageous if the radiation-curable starting materials are liquid or viscous substances.

Examples of suitable binders are polymers having a molecular weight of about 5,000 to 2,000,000, preferably 10,000 to 1,000,000. Examples are: homopolymeric and copolymeric acrylates and methacrylates, for example copolymers of methyl methacrylate, ethyl acrylate and methacrylic acid, poly(alkyl methacrylates), poly(alkyl acrylates), in which alkyl is $C_1-C_{20}$, cellulose esters and cellulose ethers, such as cellulose acetate, cellulose acetate butyrate, methylcellulose, ethylcellulose, polyvinyl butyral, polyvinyl formal, cyclized rubber, polyethers, such as polyethylene oxide, polypropylene oxide and polytetrahydrofuran; polystyrene, polycarbonate, polyurethane, chlorinated polyolefins, polyvinyl chloride, copolymers of vinyl chloride/vinylidene chloride, copolymers of vinylidene chloride with acrylonitrile, methyl methacrylate and vinyl acetate, polyvinyl acetate, copoly(ethylene/vinyl acetate), polyamides, such as poly(hexamethyleneadipamide) and polycaprolactam, polyesters, such as poly(ethylene glycol terephthalate) and poly(hexamethylene glycol succinate).

To increase the photosensitivity, it is possible to add to the radiationsensitive materials initiators and sensitizers, such as aromatic ketones, for example tetramethyl-diaminobenzophenone, benzophenone, Michler's ketone (4', 4-bis-(dimethylamino)benzophenone), 4,4'-bis-(diethylamino)-benzophenone, 4-acryloxy-4'-diethylaminobenzophenone, 4-methoxy-4'-dimethylaminobenzophenone, 2-ethylanthraquinone, phenanthraquinone, 2,6-butylanthraquinone, 1,2-benzanthraquinone, 2,3-benzanthraquinone, 2,3-dichloronaphthoquinone, benzyl dimethyl ketal and aromatic ketones according to U.S. Pat. No. 3,552,973; benzoin, benzoin ethers, such as benzoin methyl ether, benzoin ethyl ether, benzoin isobutyl ether and benzoin phenyl ether, methylbenzoin, ethylbenzoin and other benzoins, p-maleimidobenzenesulfonic acid azide, thioxanthone derivatives, such as thioxanthone, 2-chlorothioxanthone, 2-isopropylthioxanthone, ethyl thioxanthone-1-carboxylate, ethyl 3-methoxythioxanthone-1-carboxylate in conjunction with aromatic amines, such as ethyl p-dimethylaminobenzoate and 4,4'-bis-(dimethylamino)-benzophenone, and titanocenes, as described in, for example, EP-A-0,122,223 and EP-A-0,186,626. Such initiators and sensitizers are used in general in amounts of 0.1-10% by weight.

Other suitable radiation-sensitive materials are polymers which contain imide structural units of di- or tetracarboxylic acids with at least one benzophenone structural unit and amine radicals, aromatic amine radicals being substituted by $C_1-C_{12}$ alkyl, in particular methyl, ethyl or propyl, in at least one ortho-position to the imide N atom. Polyimides and corresponding amic acids or amic acid esters with aliphatic alcohols are preferred. The polymers and polyimides are described, for example, in published European Patent Applications 0,134,752, 0,138,768, 0,132,221, 0,162,017, 0,181,837, 0,182,745, 0,203,030, 0,198,798 and 0,200,680.

Thiol-ene systems for example polythiols with unsaturated polymers, such as esters of thioglycolic acid or β-mercaptopropionic acid, and polyols with polybutadiene or polyisoprene are also suitable.

The esters of naphthaquinoneazidesulfonic acids and aromatic polyols, for example novolaks, may be mentioned as an example of a positive resist.

Curing of the radiation-sensitive starting materials can be carried out by means of γ-radiation, X-radiation, electron beams, laser light and visible light up to UV radiation.

In an embodiment of the composition according to the invention, the plastic may also be an adhesive.

A preferred group of thermoplastics comprises homopolymers and copolymers of mono- or diolefins; homopolymers, copolymers and graft polymers of styrenes; halogen-containing polymers; homopolymers and copolymers of α, β-unsaturated carboxylic acids and their derivatives; homopolymers and copolymers of unsaturated alcohols and amines; homopolymers and copolymers of cyclic ethers; polyacetals, polyphenylene oxides or polyphenylene sulfides; polyurethanes; polyamides; polyureas; polyimides; polybenzimidazoles; polyesters; polycarbonates and polyester carbonates; polysulfones; polyether sulfones; polyether ketones; cellulose or cellulose derivatives.

A particularly preferred group of thermosetting plastics comprises crosslinked epoxy resins, crosslinked isocyanate-based adduct systems, unsaturated polyester resins, bismaleimide resins and phenol-formaldehyde, urea formaldehyde and melamine-formaldehyde resins.

The superconducting compound advantageously has a transition temperature $T_c$ of at least 50K., in particular at least 80K.

Superconductors having a transition temperature $T_c$ of $>>20K$ have recently been disclosed, cf. for example Phys. Rev. Let., 58, pages 1676-697 (1679), Phys. Rev. Let. 58, pages 188 Rev. Let 58, pages 2579-2581 (1987). The last publication indicates the existence of phases having a transition temperature above room temperature. The upper limit of the transition temperature is not important for the invention.

The composition according to the invention can contain up to 90% by weight of the superconducting compound. Preferably, the composition contains 10 to 80, in particular 10 to 70 and especially 10 to 60, % by weight of plastic (a) and 90 to 20, in particular 90 to 30 and especially 90 to 40%, by weight of the superconducting compound (b).

The composition according to the invention can also contain fillers and/or reinforcing fillers, the amount together with the superconducting compound being not more than 90% by weight, based on the composition. Such fillers are usually incorporated in amounts of 5 to 60, preferably 10 to 40, % by weight. In the case of radiation-curable materials, the amount may be smaller in order to ensure photosensitivity.

The superconductors used in the composition are in general prepared by a thermal sintering or melting process. The superconducting compounds thus prepared can easily be milled to give a finely divided material, which is preferably to be used. The mean particle size can be, for example, up to 500 μm, preferably 0.1 to 200 μm, in particular 1 to 100 μm and especially 1 to 50 μm.

In a preferred embodiment, the superconducting compound is a cuprate having a $K_2NiF_4$ structure of the formula I $$La_{2-w}M_wCuO_{4-\delta} \quad (I)$$

in which M is Ca, Ba or Sr and w is between 0.05 and 1.1, in particular 0.2. The value for & has not yet been determined but arises from the preparation process [Phys. Rev. Lett. 58, 405–408 (1987)]. Examples are $La_{1.8}Ba_{0.2}CuO_{4-\delta}$, $La_{1.8}Ca_{0.2}CuO_{4-\delta}$ or $La_{1.8}Sr_{0.2}CuO_{4-\delta}$.

In another embodiment, the superconducting compound can be a copper perovskite which is deficient in oxygen and contains Ba, which may be partially replaced by Ca or Sr, and one or more rare earth metals. The rare earth metals are preferably selected from the group consisting of Y Eu, La, Sc and Pr [Phys. Rev. Lett. 18, pages 1888–1890 (1987)]. These super-conducting compounds may be of the formula II $$M_3Cu_3O_x \quad (II)$$

in which x is a number from 6.7 to 7.3, preferably 6.85, and $M_3$ is a combination of alkaline earth metals and rare earth metals, for example $Ba_2Y$, $Ba_2Eu$, $Ba_2La$, $Ba_{1.8}La_{1.2}$, $BaCaLa$, $BaCaY$, $Ba_2Y_{0.75}Sc_{0.25}$, $Ba_2Eu_{0.75}Sc_{0.25}$, $Ba_2Y_{0.5}La_{0.5}$, $Ba_{1.5}Sr_{0.5}Y$, $Ba_2Eu_{0.9}Pr_{0.1}$, $Ba_2Eu_{0.9}Pr_{0.1}$, $Ba_2Eu_{0.9}Y_{0.1}$ or $Ba_2Eu_{0.75}Y_{0.25}$.

Furthermore, the superconducting compound can be $Ba_2YCu_3F_2O_y$ [Phys. Rev. Lett , 24, pages 2579–2581 (1987)]. The value for y is not defined and arises from the preparation process described. Accordingly, the value for y is such that the resulting $T_c$ is $\geq 155K$.

Recently, further high-temperature superconductor compounds have been disclosed, for example the $BaO_{0.6}K_{0.4}BiO_3$ having a transition temperature $T_c = 30K$ (R. J. Cava et al.: Nature, Vol. 332, page 814 (1988)), $Bi_2Sr_2CaCu_2O_8$ having a transition temperature $T_c = 85K$ (H. W. Zandbergen et al.: Nature, Vol. 332, page 620 (1988)), $BiSrCaCu_2O_2$ having a transition temperature $Tc = 110K$ (H. Maeda et al.: Jap. J. appl. Phys. Lett. 27 (in the press), reference from Nature 332. page 623 (1988), Bi-Al-Ca-Sr-Cu-O multiphase systems having a transition temperature $T_c = 114K$ (C. W. Chu et al.: Physical Review Letters 60, 10, page 941 (1988), $Tl_1Ca_2Ba_2Cu_3O_a$ having a transition temperature $T_c = 110K$, $Tl_2Ca_2Ba_2Cu_3O_6$ having a transition temperature $T_c = 125K$ (Superconductor Week 2, 14, 1988) and $Tl_2Ba_2CaCu_2O_8$ having a transition temperature $T_c \sim 120K$ (M. A. Subramanian et al.: Nature, Vol. 332, page 420 (1988)).

The preparation of the compositions according to the invention can be carried out by known processes by mixing the components, for example before or during the preparation of the plastic or before or during the shaping procedure. Further additives which improve or influence processing and/or the properties can be incorporated into the plastics. Examples are mould release agents, flow improvers, fluxes, plasticizers, flage-retardent agents, antistatics, lubricants, dyes, pigments, antioxidants, light stabilizers, stabilizers and fillers, for example metal oxides ($SiO_2$, $Al_2O_3$), metal carbonates and sulfates ($CaCO_3$, $MgCO_3$, $BaSO_4$), glass powder or glass spheres, silicates (talc, kaolin, wollastonite, bentonite), graphite, carbon black, fibrous reinforcing fillers, for example plastic fibres, carbon fibres and glass fibres, as well as metal-containing fillers, fillers having semiconductor properties, thermally conducting fillers, dielectrics, ferroelectrics, fillers having magnetic, piezoelectric and electrochromic properties, and phosphorus, as described in, for example, EP-A-0,182,744.

The compositions according to the invention are suitable as moulding materials for the production of shaped articles of any forms, for example, fibres, filaments, films, coatings, sheets, semifinished products and mouldings of all types. The radiation-curable compositions are suitable for the production of coatings or relief images on substrates of all types. Radiation-cured coatings can be detached from the substrate and used as films. The invention furthermore relates to shaped articles obtained from the compositions according to the invention. The shaped articles can be produced by known methods for the processing of plastics, for example by casting, coating, laminating (impregnating and multilayer methods), pressing, transfer moulding, calendering, deep drawing, extrusion and injection moulding.

The mouldings according to the invention have good mechanical stability and high diamagnetism but no superconductivity, so that even thin-walled mouldings have good screening properties for static and low-frequency magnetic fields. The mouldings are thus lightweight structural components or finished products for the economical production of forms for screening magnetic fields at technically readily attainable temperatures, for example housings for magnets or electronic apparatuses. The compositions are furthermore suitable for the production of structural components for the transmission of electrical and magnetic forces.

The invention furthermore relates to the use of the composition according to the invention for the production of shaped articles for screening magnetic fields and for transmitting electrical and magnetic forces.

The radiation-cured compositions can be processed by methods known in industry for such materials.

They are usually applied in the form of solutions in organic solvents to suitable substrate materials, such as plastics, for example polyester films, wood, paper, metals, metal alloys, semimetals, semiconductors, glass sheets, ceramic, composite materials, laminates, for example copper-plated epoxy laminates, $SiO_2$ or $Si_3N_4$. Examples of suitable organic solvents are polar, in particular polar aprotic, solvents, which can be used individually or as mixtures. Examples of such solvents are: alcohols, such as methanol, ethanol and diacetone alcohol; N-substituted amides of aliphatic monocarboxylic acids, such as N,N-dimethylformamide and N,N-dimethylacetamide; ethers, such as diethyl ether, di-n-butyl ether, tetrahydrofuran, dioxane, 2-methoxyethanol, 1,2-dimethoxyethane, diethylene glycol dimethyl ether, diethylene glycol diethyl ether, diethylene glycol mono-n-butyl ether or triethylene glycol dimethyl ether; halogenated hydrocarbons, such as methylene chloride, chloroform, carbon tetrachloride, 1,2-dichloroethane, 1,1,2-trichloroethane or 1,1,2,2-tetrachloroethane; carboxylates and lactones, such as propylene carbonate, ethyl acetate, methyl propionate, ethyl benzoate, 1-acetoxy-2-ethoxyethane, 1-acetoxy-2-methoxyethane, γ-butyrolactone and γ-valerolactone; sulfoxides, such as dimethyl sulfoxide and tetramethyl sulfoxide; sulfones, such as dimethyl sulfone, diethyl sulfone, trimethylene sulfone and tetramethylene sulfone; ketones, such as dimethyl ketone, methyl ethyl ketone, methyl isobutyl ketone and cyclohexanone; substituted benzenes, such as chlorobenzene and nitrobenzene. Preferred solvents are carboxylates and ketones, such as 2-acetoxy-2-ethoxyethane and cyclohexanone.

The solvents are applied to the substrate material by conventional methods, for example by dipping, painting, spraying, enstamping, spincoating or roller coating.

The radiation-curable compositions according to the invention can also be applied in the dry state, for example by powder coating.

The thicknesses of the dry layers are in general in the range from about 0.5 to 200 μm, preferably from 5 to 100 μm, depending on the intended use. After the coating procedure, any solvent present is removed in a conventional manner, for example by heating and, if necessary, also under reduced pressure.

It is also possible to transfer coatings obtained with the compositions according to the invention to other substrates prior to further treatment. Thus, for example, films produced on plastic sheets can be dried and then transferred by means of a roll laminator to other substrates, such as glass sheets or ceramic sheets, Monel ® substrates (Ni-Cu alloys) and tombak substrates (Cu-Zn alloys), for example silver-plated or gold-plated tombak and Monel substrates.

Curing of the compositions according to the invention or of the coatings obtained therewith can be carried out in a single stage by photocuring, if necessary at elevated temperatures, for example between 80° and 130° C. However, it is advantageously carried out in two stages, i.e. by photocuring followed by thermal postcuring at, for example, 50° to 150° C. if the radiation-curable material is a cationically polymerizable material and in particular photoinitiators from the group consisting of the cyclopentadienylironarene salts are used (cf. EP-A-0,132,744). Photocuring is advantageously carried out with visible to UV light at a wavelength of 200-600 nm and using light sources having a power of 150-8,000 watt, preferably 1,000-5,000 watt. Examples of suitable light sources are xenon lamps, argon lamps, tungsten lamps, carbon arc lamps, metal halide and metal arc lamps, such as low pressure, medium pressure and high pressure mercury lamps, argon ion lasers, double-frequency Nd-YAG-lasers (yttrium aluminium garnet), UV lasers or VIS lasers.

The exposure time depends on various factors, for example the layer thickness of the composition according to the invention, the type of light source and its distance from the layer to be exposed, as well as the type and amount of the superconducting compounds used and any further fillers. In general, the exposure time is between 1 second and 600 seconds.

In the case of uniform exposure, coated substrates are obtained which, as mentioned above, can be used as structural components for magnetic screens or mouldings for the power transmission of electrical or magnetic forces. The coatings can also be used directly for screening electronic and microelectronic components and switching elements, contacts and conductor tracks.

The irradiation (exposure) can also be carried out under a photomask.

After exposure and, if required, thermal curing, the unexposed image areas are developed by treatment with a solvent or solvent mixture. Examples of suitable solvents are those of the abovementioned type. This gives relief images down to micro size, which are used in particular in the fields of high frequency technology, electronics, microelectronics and optoelectronics. Magnetic screens of the smallest dimensions can be obtained using this process.

The invention furthermore relates to the use of the radiation-curable composition according to the invention for the production of coatings, relief images or adhesive bonds by radiation curing and, if necessary, thermal postcuring.

Coatings of the composition according to the invention and relief images on heat-resistant substrates can be subjected to heat treatment at, for example, 250° to 1,000° C., the binder (thermoplastic or thermosetting plastic, including radiation cured plastics) being decomposed and volatilized. The remaining superconducting compound can then be further heated or sintered, for example under inert gas, air or an $O_2$, $N_2$ or $H_2$ atmosphere.

In this way, it is possible to produce layers, conductor tracks and conductor patterns of superconducting compounds down to the smallest dimensions, and these can be used, for example, as printed circuits for the electrical connection of electronic components, as thick-film circuits or as contacts for integrated circuits.

The examples which follow illustrate the invention in more detail.

EXAMPLE 1

1 g of finely powdered $YBa_2Cu_3O_{6.9}$, prepared by the method in Phys. Rev. Let., 58, page 1676 (1987), and 1 g of an epoxy resin based on solid and liquid bisphenol A, having an EP value of 4.35 and dimethylaminopropylaminopropylamine-accelerated polyaminoamide as curing agent, are mixed thoroughly for 1 minute. This mixture is degassed in the course of 1 hour in vacuo (18.5 mbar). Sheets measuring $100 \times 30 \times 0.2$ mm are produced therefrom using a triangular drawing die and are cured for 12 hours at 30° C. These samples cooled with liquid nitrogen (T∼90K) float above a magnetic disc, indicating the high diamagnetism.

EXAMPLE 2

Production of a structure with the aid of photopolymers: Photopolymer formulation 30 g of bisphenol A acrylate oligomer (Chemlink ® 3000, Sartomer Company, USA)

7.5 g of 1,6-hexanediol diacrylate (SR 238, Sartomer Company, USA)

9 g of trimethylolpropane triacrylate (SR 351, Sartomer Company, USA)

2.5 g of benzil dimethyl ketal 0.5 g of isopropylthioxanthone (Ward Blenkinsop Co., UK)

49.5 g of methyl isobutyl ketone.

10 g of the above mixture are mixed with 15 g of $YBa_2Cu_3O_{7-x}$ and the mixture is homogenized. Thereafter, a few g of this mixture are introduced into a shallow dish and a pattern is inscribed in the mixture using the beam of an argon ion laser at 351-364 nm. In the exposed areas, the polymer/oxide mixture undergoes crosslinking and becomes insoluble. The exposed pattern is removed from the liquid polymer mixture using forceps and is washed with acetone, and the structure is transferred to a platinum sheet, then heated for 5 hours at 920° C. and allowed to cool slowly overnight. The oxide structure thus obtained in the form of the exposed pattern displays the Meissner effect (diamagnetism) at the temperature of liquid nitrogen.

EXAMPLE 3

Any geometric structures can be produced by photolithographic methods known in principle. For this purpose, a viscous 60% polymer solution of an epoxy-cresol novolak (ECN 1299, Ciba-Geigy) in 1-acetoxy-2-ethoxyethane is prepared. Separately from this, 66 mg of an iron-arene complex of the formula III are dissolved in 0.5 g of 1-acetoxy-2-ethoxyethane and 2 drops of dimethylformamide. The super-conducting mixed oxide YBa$_2$Cu3O6.9 (type 1230 S, particle size 1 μm, from Furu'uchi Chemicals, Japan) is heated at 950° C. for 5 hours and then comminuted in an agate mortar in the course of 10 minutes. 9.4 g of the milled mixed oxide is mixed thoroughly with 3.3 g of the polymer solution and 4 g of 1-acetoxy-2-ethoxyethane using a magnetic stirrer, after which the solution of the iron-arene complex is added with further stirring and with the exclusion of daylight. All subsequent steps up to development are likewise carried out under yellow light.

The paste described above is applied to a 40 pm thick polyester substrate film using a drawing die for 100 μm wet film thickness and is then dried in a drying oven at 80° C. in the course of 15 minutes. For contact exposure, a mask having the desired pattern is placed on the film and exposed for 30 minutes to a 2,000 W metal halide lamp (0° C. HELIOPRINT). The exposed film is postcured for 3 minutes at 110° C. in a drying oven and then developed in a solvent bath (1-acetoxy-2-ethoxyethane) for 5 seconds and then wiped with a cotton wool ball impregnated with solvent.

The developed structures have the strong diamagnetism of the incorporated mixed oxide, which is checked by allowing small pieces of film to float over a permanent magnet at the temperature of liquid nitrogen.

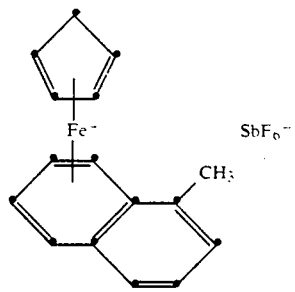

(III)

We claim:
1. A composition containing
   a) 10 to 80% by weight of a plastic selected from the group consisting of a thermosetting plastic, a mixture of thermosetting plastics, a mixture of different thermoplastics and a mixture of thermosetting plastics and thermoplastics and
   b) mixed therewith, 90 to 20% by weight of a superconducting compound which is selected from the group consisting of 1) a cuprate having a K$_2$NiF$_4$ structure of the formula La$_{2-w}$M$_w$CuO$_{4-\delta}$ wherein M is Ca, Sr or Ba, w is between 0.05 and 1.1 and δ is the oxygen deficit; 2) M'Cu$_3$O$_x$ wherein x is a number of 6.7 to 7.3 and M' is Ba$_2$Y, Ba$_2$Eu, Ba$_2$La, Ba$_{1.8}$La$_{1.2}$, BaCaLa, BaCaY, Ba$_2$Y$_{0.75}$Sc$_{0.25}$, Ba$_2$Eu$_{0.75}$Sc$_{0.25}$, Ba$_2$Y$_{0.5}$La$_{0.5}$, Ba$_{1.5}$Sr$_{0.5}$Y,- Ba$_2$Eu$_{0.9}$Pr$_{0.1}$, Ba$_2$Eu$_{0.9}$Y$_{0.1}$ or Ba$_2$Eu$_{0.75}$Y$_{0.25}$ and 3) Ba$_2$YCu$_3$F$_2$O$_y$ wherein y has a value such that T$_c$ is greater than or equal to 155K.

2. A composition according to claim 1, wherein the component a) is a thermosetting plastic.

3. A composition according to claim 2, wherein the thermosetting plastic is a crosslinked epoxy resin, a crosslinked isocyanate-based adduct system, an unsaturated polyester resin, a bismaleimide resin or a phenol-formaldehyde, urea-formaldehyde or melamine-formaldehyde resin.

4. A composition according to claim 3, wherein the epoxy resin is one based on glycidylated novolaks, hydantoins, aminophenols, bisphenols or aromatic diamines, or a cycloaliphatic epoxide.

5. A composition according to claim 4, wherein the epoxy resin is based on glycidylated cresol novolaks; bisphenol A diglycidyl ether; bisphenol A diglycidyl ether advanced with bisphenol A; 5,5-dimethylhydantoin-N,N'-bisglycide, 1,3-bis-(N,N'-diglycidyl-5,5-dimethylhydanto-4-yl)-2-glycidoxypropane, p-aminophenoltriglycide, diaminodiphenylmethanetetraglycide, vinylcyclohexene dioxide, 3,4-epoxycyclohexylmethyl 3,4-epoxycyclohexanecarboxylate or a mixture thereof.

6. A composition according to claim 3, wherein the epoxy resin contains, as a curing component, a polyamine, a novolak, a polyaminoamide or a polycarboxylic anhydride.

7. A composition according to claim 1, wherein the thermoplastic is a homopolymer or copolymer of mono- or diolefins; a homopolymer, copolymer or graft polymer of styrenes; a halogen-containing polymer; a homopolymer or copolymer of o, δ-unsaturated carboxylic acids and their derivatives; a homopolymer or copolymer of unsaturated alcohols and amines; a homopolymer or copolymer of cyclic ethers; a polyacetal, a polyphenylene oxide or a polyphenylene sulfide; a polyurethane; a polyamide; a polyurea; a polyimide; a polybenzimidazole; a polyester; a polycarbonate or a polyester carbonate; a polysulfone; a polyethersulfone; a polyether ketone; or cellulose or a cellulose derivative.

8. A composition according to claim 1, wherein the plastic is a radiation-curable or radiation-dured material.

9. A composition according to claim 1, wherein the transition temperature T$_c$ is at least 50K.

10. A composition according to claim 1, wherein the transition temperature T$_c$ is at least 80K.

11. A composition according to claim 1, which contains 10 to 70% by weight of (a) and 90 to 30% by weight of (b).

12. A composition according to claim 11, which contains 10 to 60% by weight of (a) and 90 to 40% by weight of (b).

13. A composition according to claim 1, which contains non-reinforcing fillers reinforcing fillers, the amount together with the superconducting compound being not more than 90% by weight, based on the composition.

14. A composition according to claim 1, wherein the superconducting compound is a cuprate having a K$_2$NiF$_4$ structure and of the formula I $$La_{2-w}m_wCuO \qquad (I)$$

in which M is Ca, Sr or Ba and w is between 0.05 and 1.1 and δ is the oxygen deficit.

15. A composition according to claim 14, wherein the superconducting compound is La$_{1.8}$Ba$_{0.2}$CuO$_{4-\delta}$ or La$_{1.8}$Sr$_{0.2}$O$_{4-\delta}$ or La$_{1.8}$Ca$_{0.2}$CuO$_{4-\delta}$.

16. A composition according to claim 1, wherein the superconducting compound is a copper perovskite which is deficient in oxygen and contains Ba, which may be partially replaced by Ca or Sr, and one or more rare earth metals.

17. A composition according to claim 16, wherein the rare earth metals are selected from the group consisting of Y, Eu, La, Sc and Pr.

18. A composition according to claim 17, wherein the superconducting compound is of the formula II $$M_2Cu_3O_x \quad (II)$$

in which x is a number from 6.7 to 7.3 and M is $Ba_2Y$, $Ba_2Eu$, $Ba_2La$, $Ba_{1.8}La_{1.2}$, $BaCaLa$, $BaCaY$, $Ba_2Y_{0.75}Sc_{0.25}$, $Ba_2Eu_{0.75}Sc_{0.25}$, $Ba_2Y_{0.5}La_{0.5}$, $Ba_{1.5}Sr_{0.5}Y$, $Ba_2Eu_{0.9}Pr_{0.1}$, $Ba_2Eu_{0.9}Y_{0.1}$ or $Ba_2Eu_{0.75}Y_{0.25}$.

19. A composition according to claim 1, wherein the superconducting compound is of the formula $Ba_2YCu_3F_2O_y$ in which y has a value such that $T_c \geq 155K$.

20. A composition according to claim 1, wherein the superconducting compound is a finely divided material.

21. A composition according to claim 20, wherein the superconducting compound has a mean particle size of up to 500 μm.

* * * * *